US006483881B1

(12) United States Patent
Kim et al.

(10) Patent No.: US 6,483,881 B1
(45) Date of Patent: Nov. 19, 2002

(54) METHOD OF REDUCING COMPLEXITY USING STATISTICS OF PATH METRICS IN A TRELLIS DECODER

(75) Inventors: Soo Young Kim, Taejon (KR); Soo In Lee, Taejon (KR)

(73) Assignee: Electronics and Telecommunications Research Institute, Taejon (KR)

(*) Notice: Subject to any disclaimer, the term of this patent is extended or adjusted under 35 U.S.C. 154(b) by 0 days.

(21) Appl. No.: 09/203,786

(22) Filed: Dec. 2, 1998

(30) Foreign Application Priority Data

Oct. 9, 1998 (KR) .......................................... 98-42217

(51) Int. Cl.⁷ ............................................ H03M 13/41
(52) U.S. Cl. ...................................... 375/341; 714/795
(58) Field of Search ............................ 375/262, 265, 375/340, 341; 714/791, 792, 794, 795

(56) References Cited

U.S. PATENT DOCUMENTS

| | | | | |
|---|---|---|---|---|
| 5,151,904 A | * | 9/1992 | Reiner et al. ............... | 714/795 |
| 5,208,816 A | * | 5/1993 | Seshardi et al. ............ | 714/795 |
| 5,502,735 A | * | 3/1996 | Cooper ....................... | 714/794 |
| 5,586,128 A | * | 12/1996 | Chen .......................... | 714/792 |
| 5,588,028 A | | 12/1996 | Parizhsky .................... | 375/341 |
| 5,651,032 A | | 7/1997 | Okita .......................... | 375/341 |
| 5,774,500 A | * | 6/1998 | Zogakis et al. ............. | 375/261 |
| 5,781,569 A | | 7/1998 | Fossorier et al. .......... | 371/43.7 |
| 5,944,850 A | * | 8/1999 | Chouly et al. .............. | 714/790 |
| 5,970,104 A | * | 10/1999 | Zhong et al. ................ | 375/341 |
| 6,199,191 B1 | * | 3/2001 | Iwata .......................... | 714/795 |
| 6,205,186 B1 | * | 3/2001 | Butler et al. ................ | 375/341 |
| 6,222,889 B1 | * | 4/2001 | Lee ............................. | 375/265 |
| 6,334,201 B1 | * | 12/2001 | Sawaguchi et al. ......... | 714/795 |
| 6,353,640 B1 | * | 3/2002 | Hessel et al. ............... | 375/262 |

OTHER PUBLICATIONS

Stanley J. Simmons, "Breadth–First Trellis Decoding with Adaptive Effort", IEEE Transactions on Communications, vol. 38, No. 1 Jan. 1990 pp. 3–12.

S.K. Shin et al. "Soft decision decoding of Reed–Solon on codes using trellis methods", IEE Proc.–Commun., vol. 141, No. 5, Oct. 1994, pp303–308.

K.R. Matis et al. "Reduced–Search Soft–Decision Trellis Decoding of Linear Block Codes", IEEE Transactions on Information Theory, vol. 11–28, No. 2 Mar. 1982, pp. 349–355.

* cited by examiner

*Primary Examiner*—Young T. Tse
(74) *Attorney, Agent, or Firm*—Cohen, Pontani, Lieberman & Pavane

(57) ABSTRACT

The present invention relates to a method of reducing complexity in a decoder which uses trellis decoding that can easily reduce the complexity of the decoder as much as required by reducing the paths itself using the statistics of path metric values and the reliability of the received signal. The method comprises first step of determining the reliability of bits received at the current level after initializing the level of the trellis and a flag, second step of determining the paths to be taken into account according to the reliability of received bits and computing and storing information about the determined paths and third step of obtaining the statistics of path metric values and a reference path metric by utilizing the determined path information at the current level, reducing the number of paths, and moving to the next level when total number of paths is larger than the number of maximum paths to be maintained.

7 Claims, 5 Drawing Sheets

OUTPUT BRANCH WORD

US 6,483,881 B1

METHOD OF REDUCING COMPLEXITY USING STATISTICS OF PATH METRICS IN A TRELLIS DECODER

BACKGROUND OF THE INVENTION

1. Field of the Invention

The present invention relates to a method of reducing complexity in a trellis decoder which uses trellis decoding that can easily reduce the complexity of the decoder as much as required by reducing the paths itself using the statistics of path metric values and the reliability of the received signal.

2. Art Background

In decoding schemes which use the trellis decoding such as Viterbi decoding, as the complexity of the trellis increases the performance of the decoder increases, but computational complexity of the decoder also increases.

Many studies have revealed that in these schemes almost the same performance can be obtained as the maximum likelihood decoder even though less paths are taken into account than the number of paths which are required in the maximum likelihood decoder.

In these schemes the best A paths are chosen out of total S paths. It takes lot of time, however, to carry out the algorithm of choosing A paths if S gets large. Thus, they may become less effective algorithm than the maximum likelihood decoding scheme.

Prior schemes of reducing complexity are to select a part of paths that exist in the trellis of the code. Reliability of the received bits is usually used to select the part of paths. Alternatively they select arbitrary number of paths having a good path metric value. But no prominent method has been suggested for selecting the part of paths.

Method of sorting values like path metric values has been generally used in the prior schemes. However, as the number of paths to be selected increases, it takes lot of time to carry out the sorting algorithm itself, so it is meaningless to reduce the complexity.

Thus, in the trellis decoding algorithm new scheme is essentially required which can reduce the complexity of the decoder without increase of amount of computations and which can reduce decoding time by setting aside paths almost without chance of being selected, using the statistics of path metric values and the reliability of the received signal.

SUMMARY OF THE INVENTION

It is thus an object of the present invention to provide a method of easily reducing, as much as required, the complexity of a decoder which utilizes trellis decoding without increasing the amount of computations. This is accomplished by reducing the number of paths using the reliability information of the received signal and the statistics (the mean and the standard deviation) of path metric values in a trellis decoder.

The method according to the present invention to achieve the above-mentioned purpose can be applied to a decoder using trellis decoding for reducing complexity and comprises a first step of determining the reliability of bits received at the current level (time stage) after initializing the level of the trellis and a flag, a second step of determining the paths to be taken into account according to the reliability of received bits and computing and storing information about the determined paths, and a third step of obtaining the statistics of path metric value a reference path metric. The third step is performed by utilizing the determined path information at the current level, reducing the number of paths, and moving to the next level when the total number of paths is larger than the maximum number of paths to be maintained.

BRIEF DESCRIPTION OF THE DRAWINGS

The objects, features and advantages of the present invention will be apparent to one skilled in the art from the following detailed description in conjunction with the accompanying drawings, in which.

DETAILED DESCRIPTION

Now, detailed description of the present invention follows referring to the attached figures.

Figure 1:
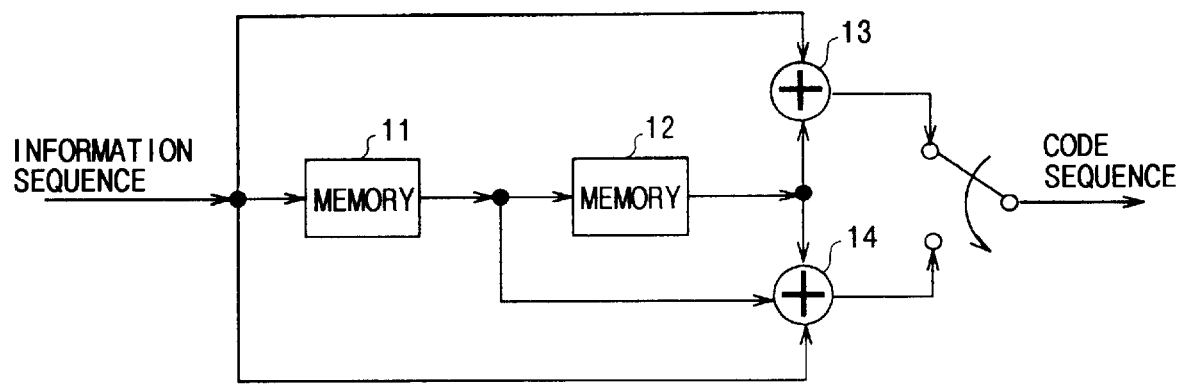
FIG. 1 is an exemplary block diagram of a general convolutional encoder.

FIG. 1 is an exemplary block diagram of a general convolutional encoder in which 11 and 12 denote memories, and 13 and 14 denote adders.

Referring to FIG. 1, the convolutional encoder shown in the figure has a simple structure with the code rate being 1/2 and the constraint length being 3.

As shown in FIG. 1, the convolutional encoder outputs 2 encoded bits each time an information bit enters, as the code rate of the encoder is 1/2. The constraint length denotes the length that an information bit affects the encoded output bits, which depends on the number of memories 11, 12 inside the encoder.

Since the structure and operation of the convolutional encoder with code rate 1/2 and constraint length 3 is well known, detailed description is omitted here except the procedure of state transition of the trellis.

In general, the number of trellis states is determined according to the number of memories 11, 12. A code rate 1/2 convolutional encoder with constraint length 3 has 2 memories 11, 12. As binary numbers can be stored in the memories 11, 12, it has $2^2$ (=4) trellis states. That is, as an information bit is input, the adders 13, 14 add it to the bits input previously and stored in the memories 11, 12, and concurrently output two encoded bits. Then, the currently input bit is shifted into memories 11 and 12 and the same procedure is repeated.

Figure 2:
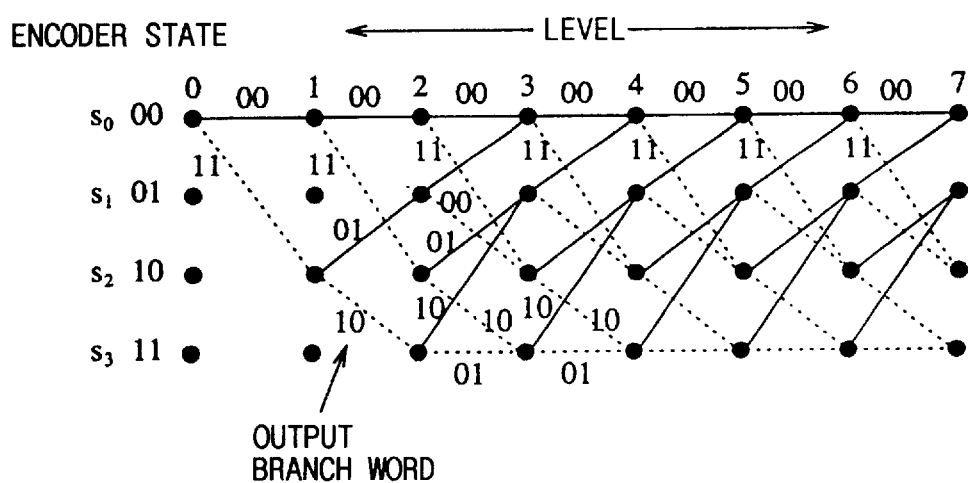
FIG. 2 is a diagram for explaining the trellis structure of FIG. 1.

The trellis diagram of the convolutional encoder is shown in FIG. 2. FIG. 2 is an explanatory diagram of the trellis structure of FIG. 1. FIG. 2 is a trellis diagram of a simple convolutional encoder with code rate being 1/2 and constraint length being 3. In this figure, solid lines denote input bit 0 and dotted lines denote input bit 1.

State transitions at each state of the trellis shown in FIG. 2 is determined by the new information bits inputted to the memories 11, 12. As the information bit is inputted bit by bit, that is with two possible values, there are two branches to the next state.

Referring to FIG. 2, each node denoted by a black dot in the trellis diagram shows the state of the encoder at certain time. The line connecting a node and a node is called a branch, which denotes a transition from the state of the encoder at the current time point to the state of the following time point. Each time point of the trellis (that is, x axis) is called a level of the trellis and the line composed of branches connecting nodes is called a path. As a result, the paths denote code words.

In the Viterbi decoding scheme, metrics for all paths (i.e., code words) existing in the trellis is computed for the inputted bits, and the path with the smallest metric value is determined as a code word. The metric value is Euclidean metric in this embodiment.

Figure 3:
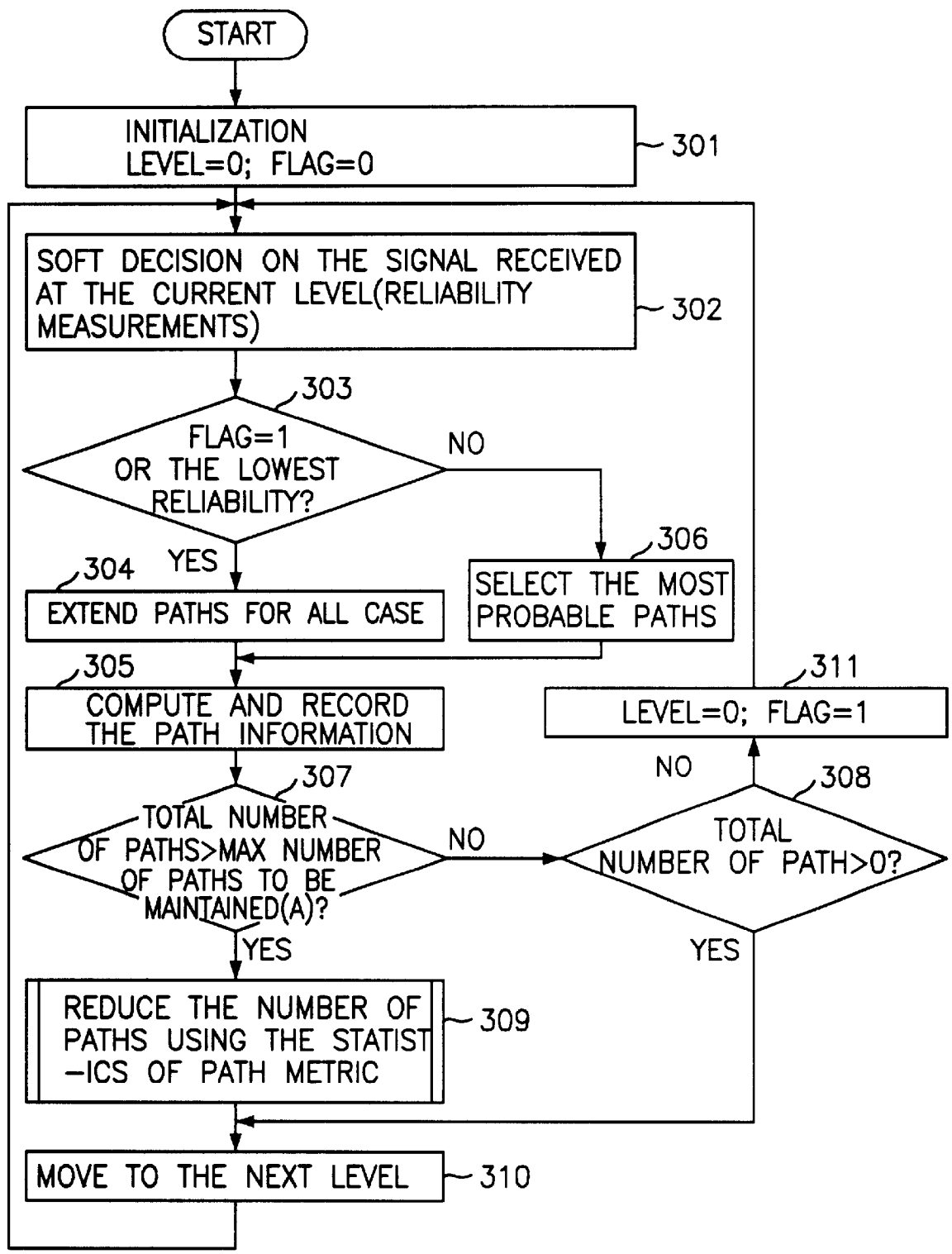
FIG. 3 is a flow chart which shows entire flow of the complexity reduction method according to the present invention.

FIG. 3 is a flow chart which shows the entire flow of the complexity reduction method according to the present invention.

The present invention utilizes the fact that in a decoder which uses the trellis decoding scheme like Viterbi decoding, almost alike performance to the maximum likelihood decoder can be achieved with only arbitrary A paths which is less than the total number of paths S and the fact that the probability distribution of path metric values at each level of the trellis is an almost Gaussian distribution.

Thus, to select good A paths out of S paths at each level of the entire trellis, the present invention reduces the number of paths based on mean and standard deviation of the path metric values at each level. Hence it can reduce the complexity of the decoder by reducing the number of paths without any additional large computations.

For example, the present invention make it possible to utilize an additional coding gains due to soft-decision decoding of a trellis decoder with a large amount of computations. That is, it can reduce the complexity of a decoder using statistics of path metric values even for the Viterbi decoder for Reed-Solomon codes, the complexity thereof being extremely high, or for the Viterbi decoder for convolutional codes with a large constraint length, the complexity thereof being too high. As any other linear block code as well as convolutional code can be expressed with the trellis, the trellis decoding technique like Viterbi decoding can be applied to them. So the soft-decision decoding can easily be applied to them achieving additional coding gain.

As shown in FIG. 3, the complexity reduction method of the present invention first initializes the level of the trellis and a flag (i.e., level=0, flag=0)(Step 301).

Then, as the reliability of the received signal can be determined based on the soft-decision information, it determines the reliability by checking the soft-decision information for the received signal at the current level (Step 302). The reliability here is a value denoting the reliability of the hard-decisioned value and the reliability value is determined by the soft-decisioned value.

If the flag is 1 or the reliability of the received signal is the smallest value (Step 303), it extends paths to take into account all possible cases (Step 304), and it computes and stores the information for all possible paths (Step 305).

If the reliability of the received signal is larger than the smallest value and if the flag is 0, the decoder only keeps the most likely paths and neglects the rest of them (Step 306), and it computes and stores the selected information for the most likely path (Step 305).

Thus, if there is little noise in the received signal, the reliability of the received signal is high and the number of paths to be considered is very small. On the contrary, if there is lot of noise in the received signal, the reliability gets low making the number of paths to be considered is increased.

If the number of paths which satisfy the current conditions gets 0 (i.e., flag=1) while decoding is continued this way, paths are extended to take into account all possible cases (Step 304), information for all paths is computed and saved (Step 305).

Then, it analyzes if the total number of paths at the current level of the entire trellis is larger than the maximum number of paths A to be maintained (Step 307).

If the total number of paths is found not to be larger than the maximum number of paths A as a result of the analysis, it checks if the total number of paths at the current level of the entire trellis is larger than 0 (Step 308).

If the total number of paths is found not to be larger than 0 as a result of the checking, it makes the level to 0 and sets the flag to 1 (Step 311), it checks the soft-decision information for the received signal at the current level to measure the reliability (Step 302).

If the total number of paths exceeds 0, it moves to the next level (Step 310). Then it checks the soft-decision information for the received signal at the next level to measure the reliability (Step 302).

If the total number of paths is found to exceed the maximum number of paths A to be maintained as a result of the analysis, the method computes the statistics of path metric values and obtains the reference path metric, then it reduces the number of paths using them (Step 309). The method then moves to the next level (Step 310) and checks the soft-decision information for the received signal at the next level to measure the reliability (Step 302).

Multiple paths always exists at each level of the trellis. The number of paths at a level generally increases as the error-correction capability of the code gets high. Also, as the number of paths increases the probability distribution of the path metrics at each level gets close to Gaussian. The distribution of the number of path metrics at an arbitrary level for various decoding schemes are shown in FIG. 4a and FIG. 4b.

Figure 4A:
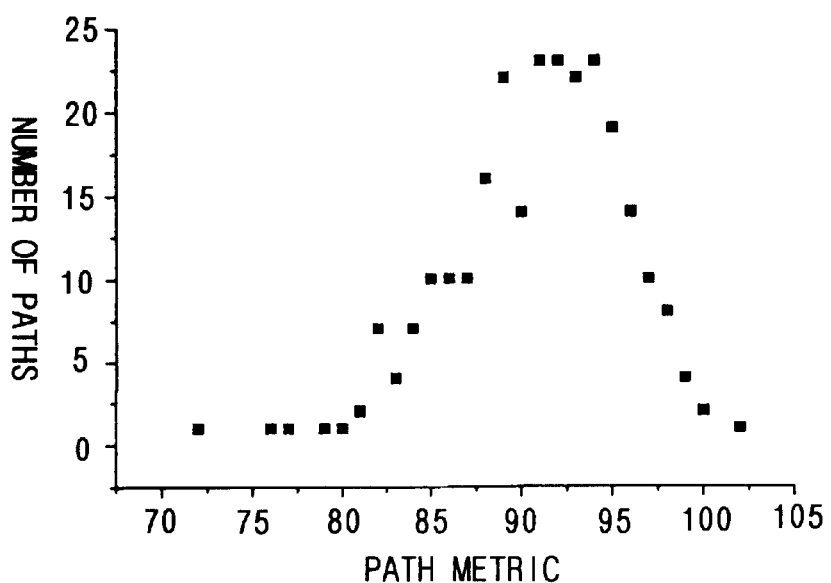
FIG. 4a and FIG. 4b show distributions of the path metric at an arbitrary level for various decoding schemes used in the present invention.

FIG. 4a shows the path matric distribution of the Viterbi decoder for a convolutional code having total 256 paths at each level. FIG. 4b shows the path matric distribution of the Viterbi decoder for a Reed-Solomon code having total 65536 paths at each level.

Figure 4B:
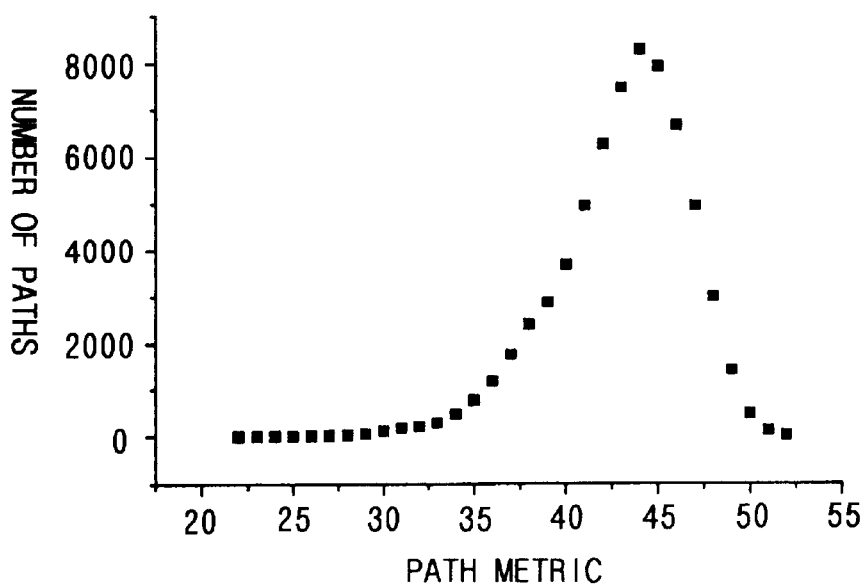

Referring to FIG. 4a and FIG. 4b, it can be seen that the probability distribution of the path metric almost follows Gaussian distribution. Thus, as it is known that the probability distribution of the path metric follows Gaussian distribution, if only A paths out of a total of S paths are to be maintained at the decoding stage, the maximum metric value of A paths can be obtained if mean and standard deviations of the path metric are known. Metric values of these A paths are larger than the reference path metric Pmr, which can be expressed as Equation 1.

$$\frac{A}{S_i} = \int_{P_{m_{r_i}}}^{\infty} \frac{1}{\sqrt{2\pi}\sigma_{P_{mi}}} \exp\left[-\frac{(x-m_{P_{mi}})^2}{2\sigma_{P_{mi}}^2}\right] dx \text{ if } A/S_i > 0.5$$

$$= 1 - \int_{P_{m_{r_i}}}^{\infty} \frac{1}{\sqrt{2\pi}\sigma_{P_{mi}}} \exp\left[-\frac{(x-m_{P_{mi}})^2}{2\sigma_{P_{mi}}^2}\right] dx \text{ if } A/S_i < 0.5$$

where, A is the maximum number of paths to be maintained at each level, $S_i$ is the total number of paths at the $i^{th}$ level, $m_{Pmi}$ is the mean of path metric values at the $i^{th}$ level, $\sigma_{Pmi}$ is the standard deviation value of the path metric at the $i^{th}$ level, and $Pm_{ri}$ is the reference path metric at the $i^{th}$ level.

The decoder simply computes the reference path metric Pmr and eliminates the paths having path metrics larger than the reference path metric to select the best A paths.

For practical systems, it could be easily implemented by normalizing the integral value into a table with mean being 0 and standard deviation being 1.

To help understanding, the above mentioned technique will be explained with an example of a code rate 1/2 convolutional code with constraint length 7.

There are 64 total paths at each level for the above coding scheme. Assuming that only 12 of these paths are always to be maintained, the number of paths starts with 2 and increases to 4, 8, and 16, thereby exceeding the required 12 paths. At this time, $A/S_i$ becomes 0.75 and the reference metric $Pm_{ri}$ is computed from Equation 1 using $m_{Pmi}$ and $\sigma_{Pmi}$ for the entire 16 paths.

Then, paths with path metrics values larger than $Pm_{ri}$ are removed. At the next level then only 24 paths (double of 12) rather than 32 paths (double of 16) exist. Here, the same procedure is applied to them to reduce the number of paths.

Figure 5:
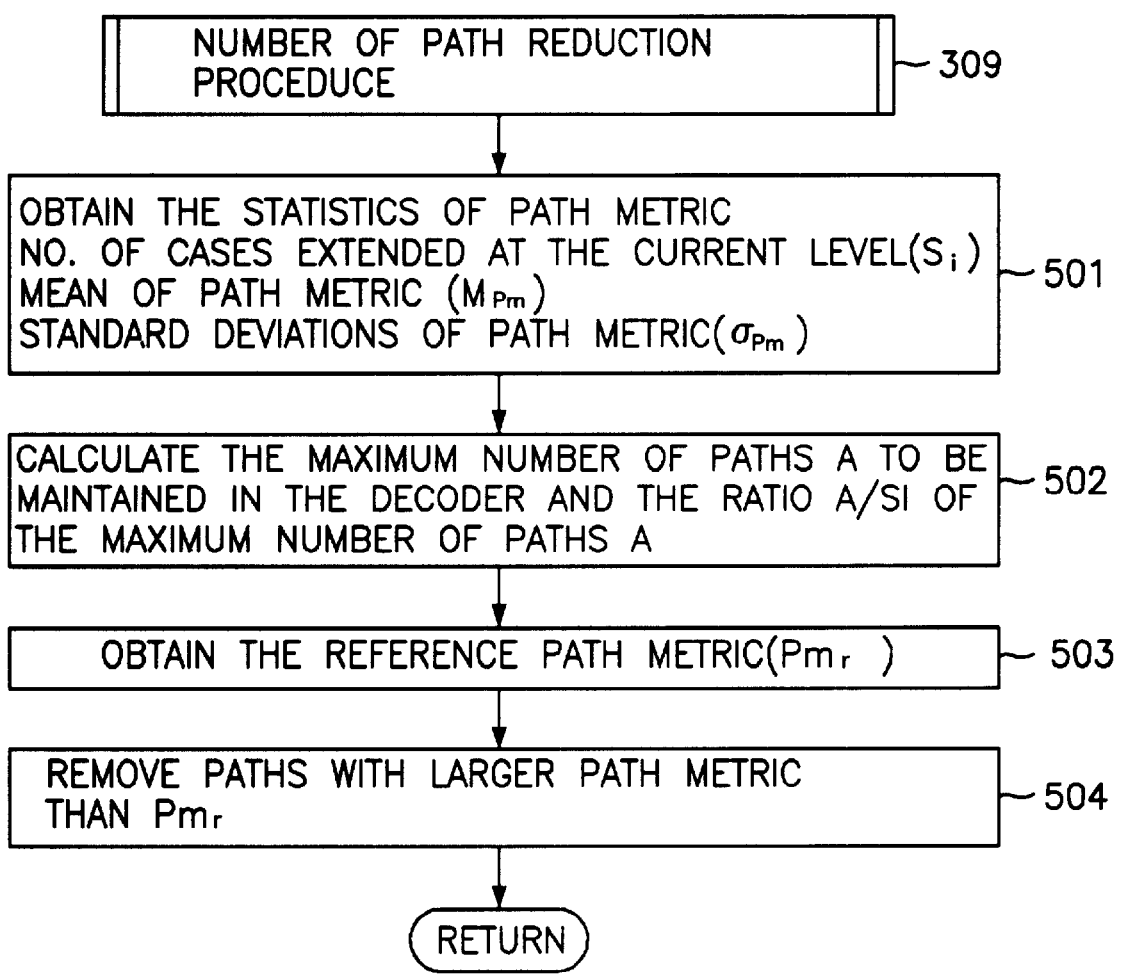
FIG. 5 is a detailed flow chart of an embodiment for the path reduction procedure using statistics of the path metric of FIG. 3.

FIG. 5 is a detailed flow chart of an embodiment for the path reduction procedure using statistics of the path metric of FIG. 3.

As shown in FIG. 5, the reduction method of the number of paths (Step 309) using the statistics of path metrics according to the present invention starts with obtaining the statistics of path metrics (Step 501). That is, it calculates a total number $S_i$ of paths extended at the current level, the mean $m_{Pmi}$ and the standard deviation $\sigma_{Pmi}$ of the path metrics.

Then, it calculates the maximum number of paths A to be maintained in the decoder by using the statistics of path metrics and the ratio $A/S_i$ which is the ratio of the maximum number of paths A to be maintained in the decoder to the total number of paths $S_i$ extended at the current level (Step 502).

Next, it calculates the reference path metric Pmr using Equation 1 (Step 503). Paths with larger path metric values than the reference path metric are removed (Step 504).

Let's take a look at the gain attainable when the present invention is applied with an example of Viterbi decoding for (15, 11) Reed-Solomon code.

Figure 6:
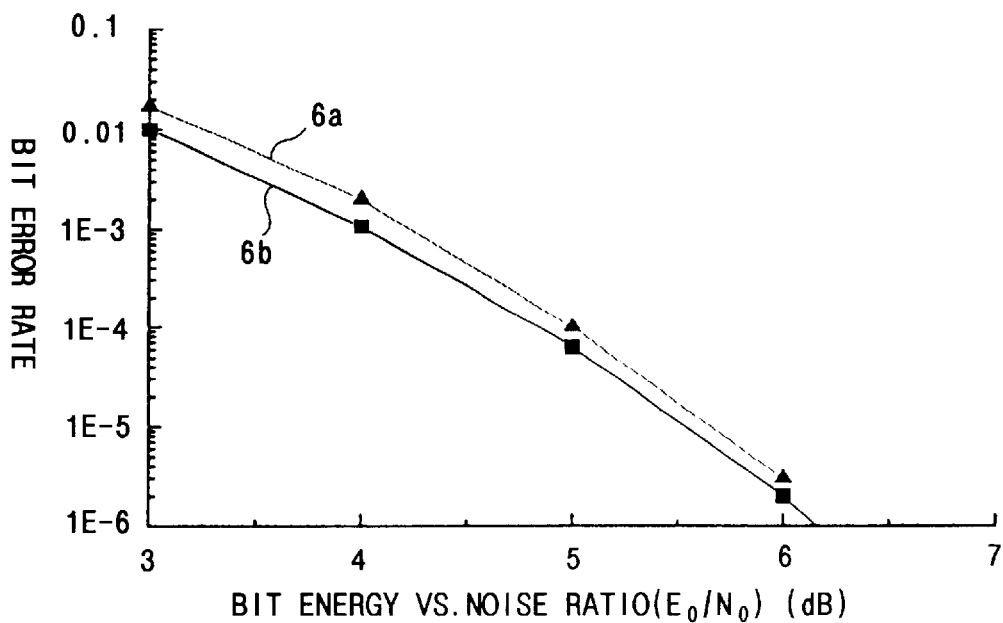
FIG. 6 shows the bit-error rate performance when the complexity reduction method of an embodiment of the present invention is applied to the Viterbi decoding scheme of the (15,11) Reed-Solomon code.
Figure 7:
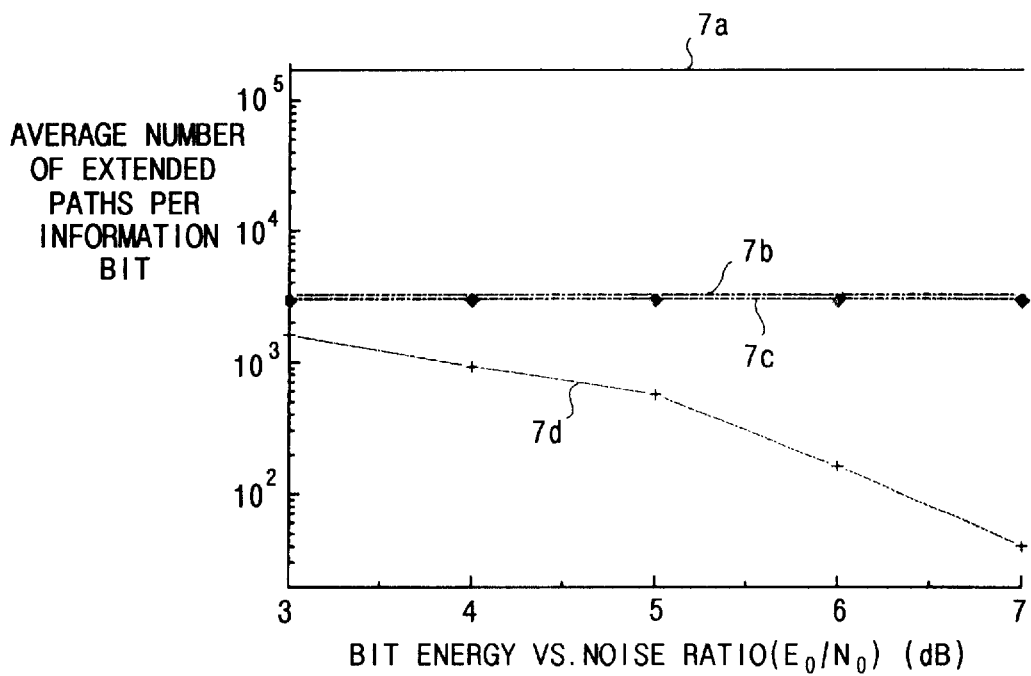
FIG. 7 is a complexity comparison chart when the complexity reduction method of an embodiment of the present invention is applied to the Viterbi decoding scheme of the (15,11) Reed-Solomon code.

There are approximately 1.7×105 paths to be extended in average for an information bit. But only 1024 paths might be maintained at each level to obtain similar performance. In this case the number of paths that should be extended for an information bit is approximately 1600. If the method suggested here is applied then further complexity reduction can be achieved. FIG. 6 and FIG. 7 show respectively the bit error rate performance and complexity comparison when the complexity reduction method of the embodiment of the present invention is applied to the Viterbi decoding scheme for the (15, 11) Reed-Solomon code.

Referring to FIG. 6, it can be seen that the bit error rate performance curves when the present invention is applied to the Viterbi decoding scheme for the (15, 11) Reed-Solomon code are similar for the case 6a when about 1024 paths is maintained at each level and the case 6b when all possible paths have been extended (that is, Viterbi decoding).

Referring to FIG. 7, it can be seen that similar number of paths 7c in the case when only the step 309 in FIG. 5 of path reduction using the statistics of path metric (7c) is used is maintained to the number of path extension which is calculated theoretically (7b). Here, 7a denotes the number of path extension in the case of Viterbi decoding.

It can be seen, therefore, that the path reduction procedure using the statistics of path metric values suggested by the present invention is very effective and accurate. Furthermore, in the case 7d when both the path reduction procedure 309 and complexity reduction procedure according to the present invention in FIG. 3 (i.e., other procedures except the path reduction procedure 309) are applied at the same time, the complexity has been further reduced, and it gets more effective when signal to noise ratio increases.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A method of reducing complexity which can be applied to a decoder using trellis decoding, comprising the steps of,
   a) determining a reliability of bits received at a current level after initializing a level of trellis and a flag;
   b) determining paths to be taken into account according to the reliability of received bits and computing and storing information about the determined paths; and
   c) obtaining statistics of path metric values and a reference path metric by utilizing determined path information at the current level, reducing the number of paths, and moving to a next level when a total number of paths is larger than a maximum number of paths to be maintained.

2. The method according to claim 1, wherein said step b) includes the steps of;
   b1) checking if the flag is 1 or if the reliability of the received bits is the minimum necessary to determine the paths to be taken into account according to the reliability of the received bits;
   b2) extending the paths to take into account all possible cases if the flag is 1 or the reliability of the received bits is the minimum necessary, and then computing and saving information for all paths;
   b3) maintaining the most likely paths and removing other paths if the reliability of the received bits is larger than a minimum value and if the flag is 0, and then computing and saving information for the selected most likely paths;
   b4) checking if the total number of paths at the current level is larger than the maximum number of paths to be maintained;
   b5) determining if the total number of paths is larger than 0 if the total number of paths at the current level is found not to be larger than the maximum number of paths to be maintained in said step b4);
   b6) setting the level to 0 and setting the flag to 1 if the total number of paths is found not to be larger than 0 in said step b5), and then checking a soft-decision information for the received signal at the current level to measure the reliability; and b7) moving to the next level if the total number of paths is found to be larger than 0 in said step b5), and then checking the soft-decision information for the received signal at the next level to measure the reliability.

3. The method according to claim 2, wherein said step c) includes the steps of:

c1) obtaining statistics of path metric values, wherein the statistics include a number of paths extended at the current level of the trellis, a mean and a standard deviation of path metric values for the case when the total number of paths at the current level is larger than the maximum number of paths to be maintained, c2) obtaining the maximum number of paths to be maintained in the decoder using said statistics of path metric values and obtaining the ratio of the number of paths extended at the current level to the maximum number of paths to be maintained in the decoder, and obtaining a reference path metric; and c3) moving to the next level after removing the paths having a larger path metric than the reference path metric.

4. The method according to claim 3, wherein said step c2) of obtaining the reference path metric is to obtain the reference path metric with the following equation using said statistics of path metric values and the number of extended paths:

$$\frac{A}{S_i} = \int_{P_{m_n}}^{\infty} \frac{1}{\sqrt{2\pi}\sigma_{Pmi}} \exp\left[-\frac{(x - m_{Pmi})^2}{2\sigma_{Pmi}^2}\right] dx \text{ if } A/S_i > 0.5$$

$$= 1 - \int_{P_{m_n}}^{\infty} \frac{1}{\sqrt{2\pi}\sigma_{Pmi}} \exp\left[-\frac{(x - m_{Pmi})^2}{2\sigma_{Pmi}^2}\right] dx \text{ if } A/S_i < 0.5$$

where, A is the maximum number of paths to be maintained at each level, $S_i$ is the total number of paths at the $i^{th}$ level, $m_{pmi}$ is the mean of path metric values at the $i^{th}$ level, $\sigma_{pmi}$ is the standard deviation of path metric values at the $i^{th}$ level, and $Pm_{ri}$ is the reference path metric at the $i^{th}$ level.

5. The method according to claim 4, wherein said statistics of path metric values and the number of extended paths are used to select a certain number of paths based on the path metric.

6. The method according to claim 4, wherein said statistics of path metric values and the number of extended paths are used to search for a certain number of paths based on the path metric.

7. A computer readable recording medium storing instructions for implementing the method for reducing complexity which can be applied to a decoder using trellis decoding, the method comprising the steps of;

a) determining a reliability of bits received at a current level after initializing a level of trellis and a flag;

b) determining paths to be taken into account according to the reliability of received bits and computing and storing information about the determined paths; and c) obtaining statistics of path metric values and a reference path metric by utilizing determined path information at the current level, reducing the number of paths, and moving to a next level when total number of paths is larger than-a maximum number of paths to be maintained.

* * * * *